United States Patent
Kim

(10) Patent No.: US 7,324,610 B2
(45) Date of Patent: Jan. 29, 2008

(54) VSB RECEPTION SYSTEM

(75) Inventor: Woo Chan Kim, Seongnam-si (KR)

(73) Assignee: LG Electronics Inc., Seoul (KR)

( * ) Notice: Subject to any disclaimer, the term of this patent is extended or adjusted under 35 U.S.C. 154(b) by 663 days.

(21) Appl. No.: 10/614,932

(22) Filed: Jul. 7, 2003

(65) Prior Publication Data

US 2004/0008801 A1  Jan. 15, 2004

(30) Foreign Application Priority Data

Jul. 11, 2002  (KR)  ............ 10-2002-0040327

(51) Int. Cl.
*H03D 1/24*  (2006.01)

(52) U.S. Cl. .............. 375/321; 375/232; 375/350; 702/17; 702/189; 702/191

(58) Field of Classification Search .......... 348/614, 348/180; 375/232, 254, 340, 341, 229; 702/189; 327/105
See application file for complete search history.

(56) References Cited

U.S. PATENT DOCUMENTS

2001/0033341 A1* 10/2001 Limberg ............ 348/614

2002/0072879 A1* 6/2002 Sweitzer et al. ............ 702/189

OTHER PUBLICATIONS

Bernard Widrow and Samuel Stearns; Adaptive Signal Processing; 1985; Prentice-Hall; pp. 99-101.*

* cited by examiner

*Primary Examiner*—David C. Payne
*Assistant Examiner*—Adolf DSouza
(74) *Attorney, Agent, or Firm*—Lee, Hong, Degerman, Kang & Schmadeka

(57) ABSTRACT

VSB reception system with a frequency domain equalizer including a demodulating part for receiving, converting, and demodulating a signal, a frequency domain equalizing part for equalizing the demodulated signal for removing a distorted component from the demodulated signal, and a noise removing part for (a) receiving the equalized signal, (b) calculating a reference error signal that is a difference between the equalized signal and the signal having the noise removed therefrom, (c) calculating an error signal that is a difference between the reference error signal and the extracted noise signal, (d) renewing parameters with reference to the reference error signal and the error signal, and (e) calculating a difference between the equalized signal and the extracted noise signal, to provide a signal having the noise removed therefrom.

11 Claims, 4 Drawing Sheets

VSB RECEPTION SYSTEM

This application claims the benefit of the Korean Application No. P2002-40327 filed on Jul. 11, 2002, which is hereby incorporated by reference.

BACKGROUND OF THE INVENTION

1. Field of the Invention

The present invention relates to VSB (Vestigial SideBand) reception systems, and more particularly, to a VSB reception system with a frequency-domain equalizer.

2. Background of the Related Art

In currently used most of the digital transmission systems and the ATSC (Advanced Television Systems Committee) 8VSB transmission system suggested as digital TV transmission system for the USA, when a broadcasting signal is transmitted through air or a line, a digital TV receiver receives the broadcasting signal together with signals reflected at various reflectors. Since reflected components distort an original signal, the original signal can not be obtained from the received signal only. The components which distort the original signal are ghost or fading.

The signal distorted thus causes a bit detection error in the digital TV receiver, such that restoration of a whole picture is impossible, or a totally different picture is displayed.

In order to overcome this problem, an equalizer is used in the digital TV receiver for correcting the components (i.e., the ghost or the fading) that distort a signal transmitted between a transmission terminal and a reception terminal.

In the equalizers, there are a time-domain equalizer and frequency-domain equalizer, all of which serve to remove the components that distort the original signal.

The frequency-domain equalizer assumes an impulse response of a channel from a time domain signal, and converts the impulse response into a frequency domain signal. Then, the frequency-domain equalizer controls parameters of the frequency-domain equalizer so that the frequency domain signal distorted on the channel becomes an ideal frequency domain signal, for correcting the distortion. That is, after a received time domain signal is converted into a frequency domain signal, the fading components are corrected by a frequency domain equalizer. Then, the corrected frequency domain signal is converted into a time domain signal, again.

FIG. 1 illustrates a block diagram of a related art VSB reception system with a frequency domain equalizer, wherein the demodulating part 1 tunes to a desired channel from RF (Radio Frequency) signals received through an antenna, converts a RF signal on the tuned channel into an IF (Intermediate Frequency) signal, demodulates the IF signal in reverse of a VSB modulating system, and provides to the frequency domain equalizing part 2. Then, the frequency domain equalizing part 2 assumes the impulse response of the channel from the time domain signal received thus, converts the impulse response into a frequency domain signal, and corrects fading components thereof by controlling parameters.

However, once a signal with the fading components passes through the frequency domain equalizing part 2, though the fading components are corrected, an amplification of noise is occurred, too.

FIGS. 2A and 2B illustrate diagrams each showing a fading signal in a VSB signal, wherein FIG. 2A illustrates a channel impulse response having a main signal and three fading signals, and FIG. 2B illustrates a frequency spectrum of an ideal signal from a transmitter, and a frequency spectrum having fading, of a signal from a transmitter, in which an AWGN (additive white gaussian noise) is contained.

FIG. 3A illustrates a diagram showing a signal, and a noise spectrum before equalizing, and FIG. 3B illustrates a diagram showing a signal, and a noise spectrum after equalizing.

Referring to FIG. 3A, the signal before equalizing contains the AWGN in all bandwidths, and the signal containing the fading has a very small spectrum size in a particular frequency bandwidth. As shown in FIG. 3B, though the signal after the equalizing, having the fading corrected, shows an ideal signal form, a power of the AWGN is increased after equalizing. Such an increase of noise causes poor performance of a whole system.

SUMMARY OF THE INVENTION

Accordingly, the present invention is directed to a VSB reception system that substantially obviates one or more of the problems due to limitations and disadvantages of the related art.

An object of the present invention is to provide a VSB reception system which can remove the increased noise in an equalized signal.

Additional features and advantages of the invention will be set forth in the description which follows, and in part will be apparent to those having ordinary skill in the art upon examination of the following or may be learned from practice of the invention. The objectives and other advantages of the invention will be realized and attained by the structure particularly pointed out in the written description and claims hereof as well as the appended drawings.

To achieve these objects and other advantages and in accordance with the purpose of the present invention, as embodied and broadly described herein, the VSB reception system includes a demodulating part for receiving, converting, and demodulating a signal, a frequency domain equalizing part for equalizing the demodulated signal for removing a distorted component from the demodulated signal, and a noise removing part for (a) receiving the equalized signal, (b) calculating a reference error signal that is a difference between the equalized signal and the signal having the noise removed therefrom, (c) calculating an error signal that is a difference between the reference error signal and the extracted noise signal, (d) renewing parameters with reference to the reference error signal and the error signal, and (e) calculating a difference between the equalized signal and the extracted noise signal, to provide a signal having the noise removed therefrom.

In this instance, the frequency domain equalizing part carries out converting a received time domain signal into the frequency domain signal, equalizing the frequency domain signal, and converting the equalized frequency domain signal into a time domain signal.

That is, the frequency domain equalizing part carries out assuming a channel impulse response from a received time domain signal, converting the assumed channel impulse response and the time domain signal into frequency domain signals respectively, renewing parameters with reference to the converted frequency domain signal, to correct a distortion of the frequency domain signal, and converting the frequency domain signal having the distortion therein corrected into a time domain signal.

The noise removing part includes a first operator for calculating a difference between signals from/to the noise removing part, to provide a reference error signal, a second operator for calculating a difference between the reference error signal and the extracted noise signal, to provide an error signal, a filtering part for renewing parameters with reference to the reference error signal from the first operator and the error signal from the second operator, to extract a noise signal, and a third operator for calculating a difference between a signal from the noise removing part and the noise signal extracted at the filtering part to provide a signal having the noise removed therefrom.

The VSB reception system further includes a deciding part between the first operator and the third operator for making decision with reference to a signal from the third operator.

The noise removing part further includes a first delay for delaying, and forwarding a signal received at the noise removing part to the first operator, a second delay for delaying, and forwarding a signal from the third operator to the first delay, and a third delay for delaying, and forwarding the noise signal extracted at the filtering part to the second operator.

The filtering part is an LMS (Least Mean Square) filter for renewing the parameters by LMS method.

The first, second, and third operators are subtractors or adders.

It is to be understood that both the foregoing description and the following detailed description of the present invention are exemplary and explanatory and are intended to provide further explanation of the invention claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENT

Figure 1:
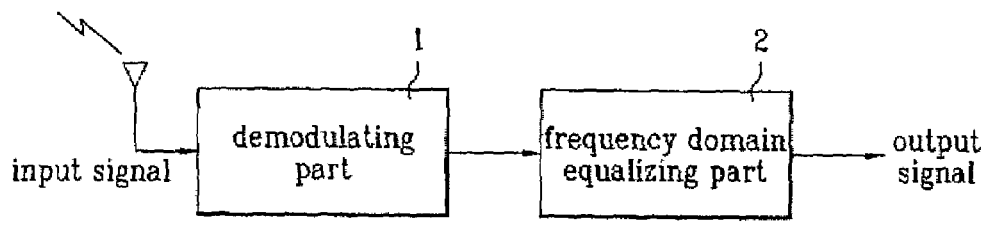
FIG. 1 illustrates a block diagram of a related art VSB reception system.
Figure 2A:
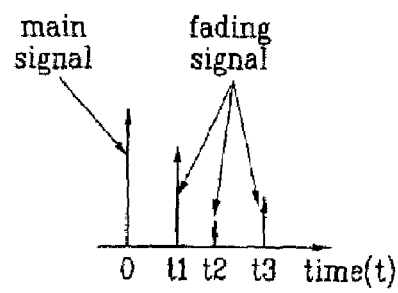
FIGS. 2A and 2B illustrate diagrams each showing a fading signal in a VSB signal.
Figure 2B:
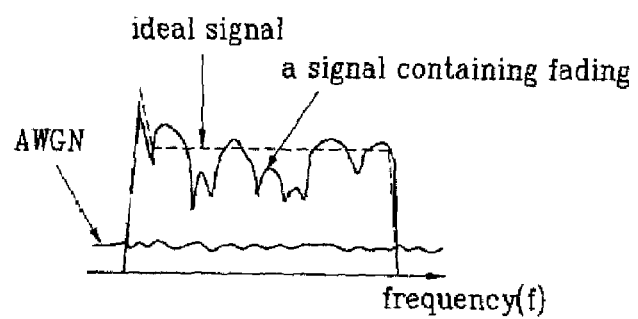
Figure 3A:
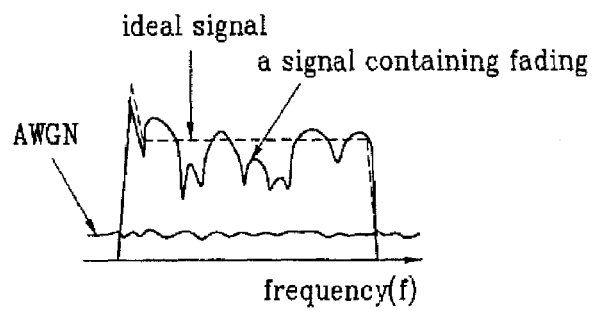
FIG. 3A illustrates a diagram showing a signal, and a noise spectrum before equalizing.
Figure 3B:
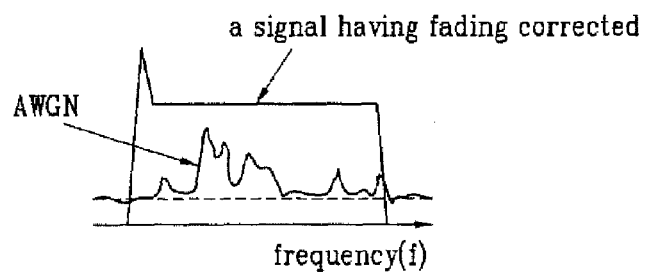
FIG. 3B illustrates a diagram showing a signal, and a noise spectrum after equalizing.
Figure 4:
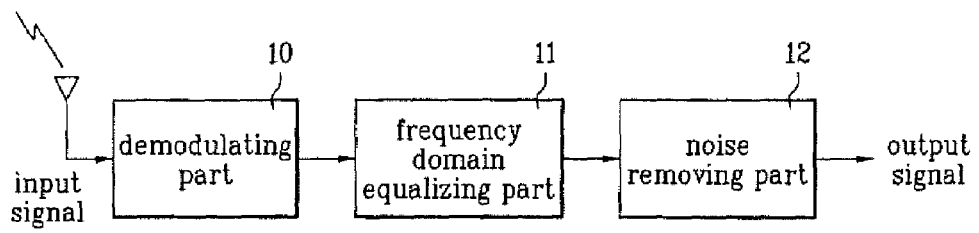
FIG. 4 illustrates a block diagram of a VSB reception system in accordance with a preferred embodiment of the present invention.

Reference will now be made in detail to the preferred embodiments of the present invention, examples of which are illustrated in the accompanying drawings. FIG. 4 illustrates a block diagram of a VSB reception system in accordance with a preferred embodiment of the present invention, and FIG. 5 illustrates a diagram showing the noise removing part in FIG. 4.

Referring to FIG. 4, the VSB reception system in accordance with a preferred embodiment of the present invention includes a demodulating part 10 for receiving, converting, and demodulating a signal, a frequency domain equalizing part 11 for equalizing a demodulated signal to remove a distorted component from the demodulated signal, and a noise removing part 12 for removing a noise from an equalized signal.

Figure 5:
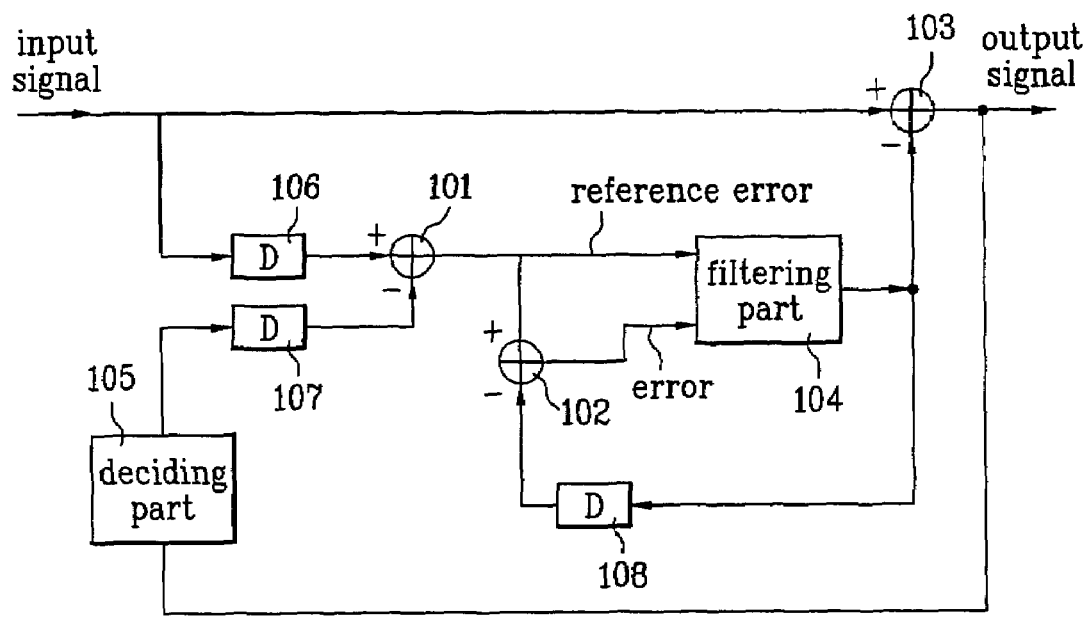
FIG. 5 illustrates a diagram showing the noise removing part in FIG. 4.

Referring to FIG. 5, the noise removing part 12 includes a first operator 101 for calculating a difference between a signal equalized at the frequency domain equalizing part 11 and a signal from a third operator 103, a second operator 102 for calculating a difference between a reference error signal and a noise signal extracted at a filtering part 104 and providing an error signal, the filtering part 104 for renewing parameters with reference to the reference error signal from the first operator 101 and the error signal from the second operator 102 and extracting a noise signal, and a third operator 103 for calculating a difference between an equalized signal and an extracted noise signal to provide a signal having noise removed therefrom.

There is a deciding part 105 between the first operator 101 and the third operator 103 for making a decision with reference to a signal from the third operator 103. In the present invention, a VSB slicer is employed as the deciding part 105. The VSB slicer decides a VSB signal by using a variety of algorithms.

The first operator 101 may be a subtractor. The second and third operators 102 and 103 may be subtractors or adders.

FIG. 5 illustrates an example showing subtractors employed as the first, second, and third operators. Though not shown, instead of the subtractor 102, an adder may be employed together with an inverter, and instead of the subtractor 103, an adder may be employed.

The noise removing part 12 may further includes a first delay 106 for delaying and forwarding a signal equalized at the frequency domain equalizing part 11 to the first operator 101, a second delay 107 for delaying and forwarding a signal from the third operator 103 to the first delay 101, and a third delay 108 for delaying and forwarding a noise signal extracted at the filtering part 104 to the second operator 102.

The noise removing part 12 of the present invention may employ an LMS (Least Mean Square) filter as the filtering part 104 for renewing the parameters by LMS method.

The filtering part 104 may be a filter employing an algorithm, such as RLS or Kalman, and having a structure of a tapped-delay-line or lattice.

The operation of the VSB reception system of the present invention will be described.

The demodulating part 10 tunes to a desired channel from received RF signals, converts the RF signal of a tuned channel into an IF signal, and demodulates the IF signal in reverse of a VSB modulating method. A signal demodulated at the demodulating part 10 is provided to the frequency domain equalizing part 11.

The frequency domain equalizing part 11 receives, and converts a time domain signal into a frequency domain signal, equalizes the frequency domain signal, and converts an equalized frequency domain signal into a time domain signal. That is, the frequency domain equalizing part 11 assumes an impulse response of a channel from the received time domain signal, and converts the assumed channel impulse response and the time domain signal into frequency domain signals, respectively. Then, the frequency domain equalizing part 11 renews parameters with reference to the converted frequency domain signal, to correct distortion of the frequency domain signal (correct fading), and converts the frequency domain signal having a distortion therein corrected into a time domain signal, again.

A signal equalized at the frequency domain equalizing part 11 (having fading therein corrected) is provided to the noise removing part 12.

The first operator 101 in the noise removing part 12 receives the equalized signal from the frequency domain equalizing part 11, and calculates the reference error signal that is a difference between the equalized signal and the signal having noise removed therefrom at the third operator 103. In this instance, the signal having noise removed therefrom is subjected to a decision at the deciding part 105 and provided to the first operator 101.

Then, the second operator 102 of the noise removing part 12 calculates an error signal that is a difference between the reference error signal and the noise signal extracted at the filtering part 104. Next, the filtering part 104 renews parameters with reference to the reference error signal and the error signal. In this instance, the filtering part 104 employs an LMS filter of a tapped delay-line form.

In the parameter renewal at the filtering part 104, the following equation is used.

$$c(k, n+1) = c(k, n) + u*e(n)*x(k, n)$$

Where, 'n' denotes 0, 1, 2, - - -, and 'k' denotes a (k)th tap parameter. 'u' denotes a constant for fixing a magnitude of a renewed value, 'e(n)' denotes a received error value, 'x(k, n) denotes an input value of a (k)th tap at a time 'n'.

Finally, by calculating a difference between an equalized input signal and the nose signal extracted at the filtering part 104, the third operator 103 in the noise removing part 12 can provides a signal having the noise removed therefrom.

Figure 6A:
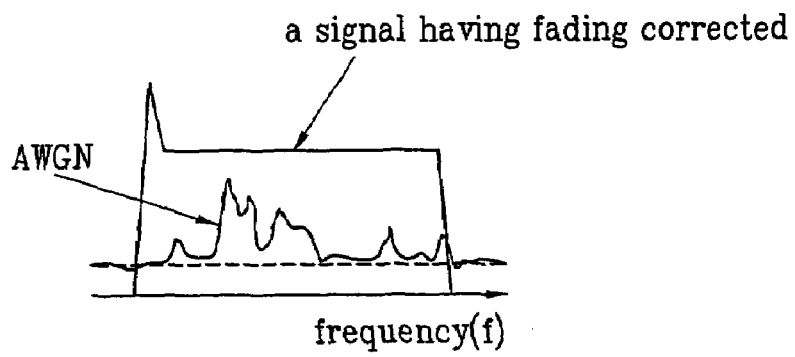
FIGS. 6A and 6B illustrate diagrams showing noise spectra before/after noise removal with a VSB reception system of the present invention, respectively.
Figure 6B:
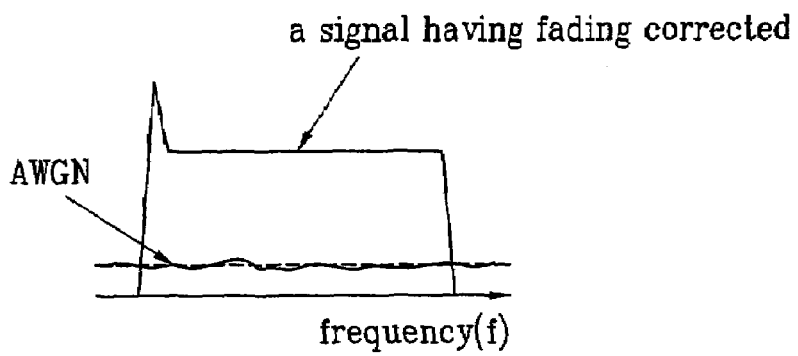

FIGS. 6A and 6B illustrate diagrams showing noise spectra before/after noise removal with a VSB reception system of the present invention, respectively.

Referring to FIG. 6A, the signal equalized at the frequency domain equalizing part contains an amplified noise. As shown in FIG. 6B, it can be noted that the amplified noise is reduced significantly as the noise is removed at the noise removing part of the present invention.

Figure 7:
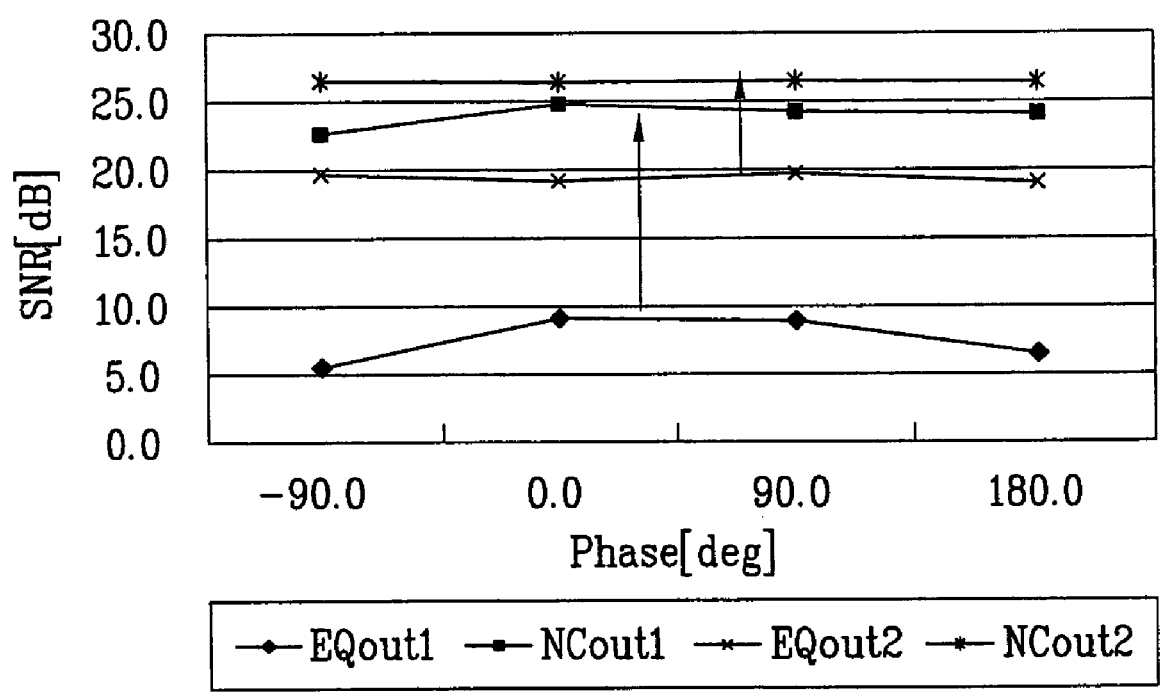
FIG. 7 illustrates a graph showing a performance evaluation of the VSB reception system of the present invention.

FIG. 7 illustrates a graph showing a performance evaluation of the VSB reception system of the present invention, wherein an SNR (Signal to Noise Ratio) of a signal after use of the noise removing part is shown.

In FIG. 7, EQout1 denotes an SNR of a signal from an equalizer for a channel having approx. 0.2 usec, and approx. –0.1 dB fading, and NCout1 denotes an SNR of a signal from an noise removing part for a channel having approx. 0.2 usec, and approx. –0.1 dB fading. EQout2 denotes an SNR of a signal from an equalizer for a channel having approx. 3.0 usec, and approx. –0.5 dB fading, and NCout2 denotes an SNR of a signal from an noise removing part for a channel having approx. 3.0 usec, and approx. –0.5 dB fading.

Referring to FIG. 7, it can be noted that the present invention improves the SNR as EQout1 is approx. 5-9 dB while NCout1 is approx. 22-25 dB, and EQout2 is in a range of approx. 19 dB while NCout2 is in a range of approx. 26 dB.

Thus, by employing the noise removing part, the VSB reception system of the present invention can remove the noise amplified by the frequency domain equalizer, thereby improving the SNR and an overall system performance.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A VSB reception system comprising:
   a demodulating part for receiving, convening, and demodulating a signal;
   a frequency domain equalizing part for equalizing the demodulated signal for removing a distorted component from the demodulated signal; and
   a noise removing pan for (a) receiving the equalized signal, (b) calculating a reference error signal that is a difference between the equalized signal and a signal having noise extracted therefrom (c) receiving the reference error signal and a noise signal extracted from the equalized signal at a first operator which calculates an error signal that is a difference between the reference error signal and the noise signal extracted from the equalized signal, (d) renewing parameters with reference to the reference error signal and the error signal, and (e) calculating a difference between the equalized signal and the extracted noise signal, to provide the signal having the noise extracted therefrom.

2. The VSB reception system as claimed in claim 1, wherein the demodulating part carries out tuning to a desired channel from received RF (Radio Frequency) signals, converting a RE signal on the tuned channel into an IF (Intermediate Frequency) signal, and demodulating the IF signal in reverse of a VSB modulating method.

3. The VSB reception system as claimed in claim 1, wherein the frequency domain equalizing part carries out converting a received time domain signal into the frequency domain signal, equalizing the frequency domain signal, and converting the equalized frequency domain signal into a time domain signal.

4. The VSB reception system as claimed in claim 1, wherein the frequency domain equalizing part carries out assuming a channel impulse response from a received time domain signal, converting the assumed channel impulse response and the time domain signal into frequency domain signals respectively, renewing parameters with reference to the converted frequency domain signal, to correct a distortion of the frequency domain signal, and converting the frequency domain signal having the distortion therein corrected into a time domain signal.

5. The VSB reception system as claimed in claim 1, wherein the noise removing part includes;
   a second operator for calculating a difference between signals from/to the noise removing part, to provide the reference error signal,
   a filtering part for renewing parameters with reference to the reference error signal from the second operator and the error signal from the first operator, to extract the noise signal, and
   a third operator for calculating a difference between a signal from the noise removing part and the noise signal extracted at the filtering part to provide the signal having the noise extracted therefrom.

6. The VSB reception system as claimed in claim 5, further comprising a deciding part between the second operator and the third operator for making decision with reference to a signal from the third operator.

7. The VSB reception system as claimed in claim 6, wherein the deciding part is a VSB slicer.

8. The VSB reception system as claimed in claim 5, wherein the noise removing pan further includes;
    a first delay for delaying, and forwarding a signal received at the noise removing part to the second operator,
    a second delay for delaying, and forwarding a signal from the third operator to the second operator, and a third delay for delaying, and forwarding the noise signal extracted at the filtering part to the first operator.

9. The VSB reception system as claimed in claim 5, wherein the filtering pan is an LMS (Least Mean Square) filter for renewing the parameters by LMS method.

10. The VSB reception system as claimed in claim 9, wherein the renewal of the parameters by LMS method uses the following equation;

$$c(k, n+1)=c(k, n)+u*e(n)*x(k, n)$$

where, 'n' denotes 0, 1, 2, ----, and 'k' denotes a (k)th tap parameter, 'u' denotes a constant for fixing a magnitude of a renewed value, 'e(n)' denotes a received error value, 'x(k, n) denotes an input value of a (k)th tap at a time 'n'.

11. The VSB reception system as claimed in claim 5, wherein the first, second, and third operators are subtractors or adders.

* * * * *